(12) United States Patent
Sakata

(10) Patent No.: US 7,119,531 B2
(45) Date of Patent: Oct. 10, 2006

(54) PUSHER IN AN AUTOHANDLER FOR PRESSING A SEMICONDUCTOR DEVICE

(75) Inventor: Toru Sakata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/910,611

(22) Filed: Aug. 4, 2004

(65) Prior Publication Data

US 2005/0030007 A1    Feb. 10, 2005

(30) Foreign Application Priority Data

Aug. 6, 2003    (JP)    ............................. 2003-287262

(51) Int. Cl.
*G01R 31/28*    (2006.01)

(52) U.S. Cl. ................................. 324/158.1

(58) Field of Classification Search ..................... None
See application file for complete search history.

(56) References Cited

U.S. PATENT DOCUMENTS

| 5,500,605 | A | * | 3/1996 | Chang | .................. | 324/758 |
| 5,539,324 | A | * | 7/1996 | Wood et al. | ................ | 324/758 |
| 5,604,446 | A | * | 2/1997 | Sano | .................. | 324/758 |
| 5,825,192 | A | * | 10/1998 | Hagihara | .................. | 324/757 |
| 5,847,571 | A | * | 12/1998 | Liu et al. | .................. | 324/754 |
| 6,060,891 | A | * | 5/2000 | Hembree et al. | .......... | 324/754 |
| 6,084,421 | A | * | 7/2000 | Swart et al. | ................. | 324/755 |
| 6,130,543 | A | * | 10/2000 | Iino | .................. | 324/754 |
| 6,252,414 | B1 | * | 6/2001 | Boyette et al. | ............. | 324/758 |
| 6,320,398 | B1 | * | 11/2001 | Ito et al. | ..................... | 324/755 |
| 6,705,095 | B1 | * | 3/2004 | Thompson et al. | ........... | 62/117 |
| 6,784,657 | B1 | * | 8/2004 | Fujishiro et al. | ......... | 324/158.1 |
| 6,907,742 | B1 | * | 6/2005 | Kuo | .................. | 62/62 |

FOREIGN PATENT DOCUMENTS

JP    2001-113457    4/2001

* cited by examiner

*Primary Examiner*—Vinh Nguyen
*Assistant Examiner*—Richard Isla-Rodas
(74) *Attorney, Agent, or Firm*—Young & Thompson

(57) ABSTRACT

A pusher provided in an autohandler presses a semiconductor device toward a socket to allow the electrodes thereof to contact the socket pins of the socket during testing the electric characteristics of the semiconductor device. The pusher includes a rigid pusher body and a balloon receiving therein fluid and provided on the front end of the pusher body. The pressure inside the balloon is controlled to allow the balloon to press the semiconductor device with a uniform pressure.

9 Claims, 6 Drawing Sheets

PUSHER IN AN AUTOHANDLER FOR PRESSING A SEMICONDUCTOR DEVICE

BACKGROUND OF THE INVENTION (a) Field of the Invention

The present invention relates to a pusher in an autohandler for pressing a semiconductor device and, more particularly, to a pressing device used in an autohandler for pressing a semiconductor device to allow electrodes of the semiconductor device to contact respective pins of a socket during testing the electric characteristics of the semiconductor device.

(b) Description of the Related Art

Measurement of electric characteristics of a semiconductor device, or semiconductor integrated circuit, is performed using an autohandler and a socket having a plurality of socket pins. The autohandler includes a pusher for pressing the semiconductor device from the top surface thereof toward the socket to allow the electrodes of the semiconductor chip to mechanically and electrically contact the socket pins, for measurement of the electric characteristics of the semiconductor device.

FIG. 7 is a schematic sectional view showing the locational relationship between the autohandler and the semiconductor device.

The autohandler 60 shown in FIG. 7 includes a pusher 61 and an inserter 62, and handles a packaged semiconductor device 63 for measurement of the electric characteristics thereof. The semiconductor device 63 carried by the inserter 62 is pushed or pressed in the direction "A" by the pusher 61 toward the socket 65, thereby allowing the bottom electrodes 64 of the semiconductor device 63 to contact the respective socket pins 66 of the socket 65.

The requirements for the pusher 61 of the autohandler 60 include a uniform pressure being applied onto the top surface of the chip of the semiconductor device 63, i.e., device under test (DUT). The techniques for applying a uniform pressure onto the surface of the semiconductor chip include one used in the field of mechanical polishing of the semiconductor chip by using a polishing head. In this technique, an elastic pressure film is interposed between the chip and the polishing head, and a fluid pressure is applied via the elastic pressure film onto the semiconductor chip in order to press the chip toward a table. This technique utilizes the principle that the elastic pressure film expands under the fluid pressure. Such a technique is described in JP-A-2001-113457, for example.

The structure of the pusher 61 shown in FIG. 7 suffers from a problem as described hereinafter. If the semiconductor device 63 shown in FIG. 7 is a hybrid semiconductor device including a plurality of semiconductor chips, such as including DRAM and SOC chips, and thus has a significant step difference on the top surface thereof, the pusher 61 should have a shape adapted to the step difference. This may be achieved, as shown in FIG. 8, by designing a new pusher 61A having a front surface adapted to the step difference formed between the chip 65a and the chip 65b of the semiconductor device 63. However, such semiconductor devices may have a range of variation in the step difference, and thus render the pressure applied to the semiconductor device by the new designed pusher 61A to be ununiform as a whole.

In addition, since there are differences in the chip size between the types of devices, e.g., between the all-purpose semiconductor device such as a TSOP (thin small out-line package) device and the BGA (ball grid array) device or CSP (chip size package) device, a dedicated pusher is generally used for each of the respective types of the devices. This increases the man power for design and manufacture of the pusher, thereby increasing the TAT and cost of the semiconductor devices.

With reference to FIG. 9, there is shown that another autohandler 60A is used to measure the electric characteristics of a plurality of semiconductor chips 66a to 66c of the same type, however, having different thicknesses due to variation of the thickness. In such a case, since the pushers 61a to 61b advance a constant distance for pressing the semiconductor chips 66a to 66c, the loads applied to the semiconductor chips 66a to 66c differ from one another depending on the difference in the thickness of the chips 66a to 66c.

In the technique described in the above patent publication, it is not considered to apply a uniform load to a plurality of types of semiconductor chips having different thicknesses. Thus, the described technique cannot apply a uniform load onto the semiconductor device having thereon a step difference due to different thicknesses of the chips. In particular, since the elastic pressure film has suction holes thereon, the described technique cannot be applied to a pusher for pressing the semiconductor device including a plurality of chips having different thicknesses.

SUMMARY OF THE INVENTION

In view of the above problems in the conventional technique, it is an object of the present invention to provide a pusher for use in an autohandler, which is capable of applying a uniform pressure onto a semiconductor device including a plurality of semiconductor chips therein having different dimensions.

It is another object of the present invention to provide a pusher capable of accurately controlling the load applied to a semiconductor device.

It is another object of the present invention to provide a testing device having such a pusher.

The present invention provides a pusher in an autohandler for pressing a semiconductor device, including: a pusher body; and a pressure head attached onto the pusher body for pressing the semiconductor device, the pressure head including a balloon and fluid received in the balloon.

The present invention also provides a testing device for testing a semiconductor device including: a socket including a plurality of test pins connected to a test circuit; and a pusher for pressing the semiconductor device toward the socket, thereby allowing a plurality of electrodes of the semiconductor device to contact respective the test pins, the pusher including: a pusher body; and a pressure head attached onto the pusher body for pressing the semiconductor device, the pressure head including a balloon and fluid received in the balloon.

In accordance with the pusher and testing device of the present invention, a uniform pressure can be applied to the semiconductor device by the pusher due to the configuration of the pusher including the balloon receiving therein fluid.

The above and other objects, features and advantages of the present invention will be more apparent from the following description, referring to the accompanying drawings.

PREFERRED EMBODIMENT OF THE INVENTION

Figure 1:
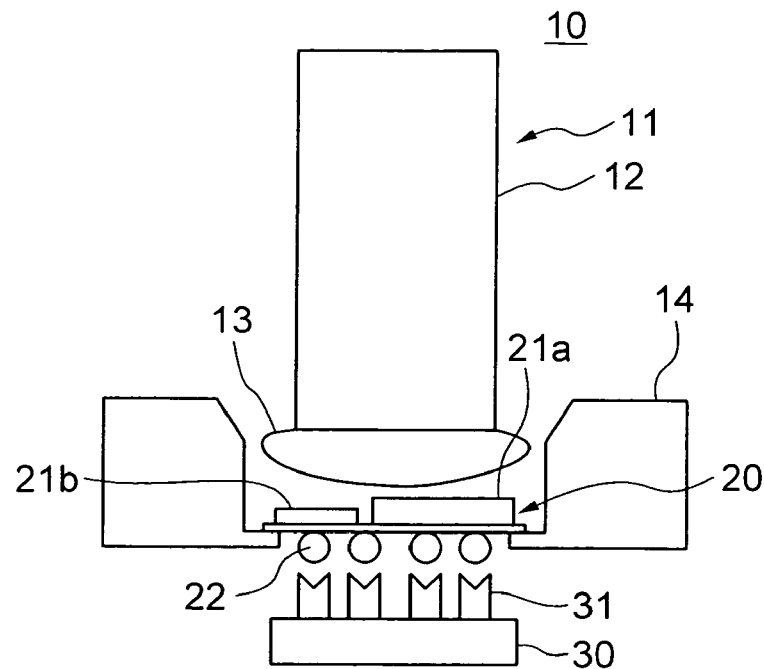
FIG. 1 is a schematic sectional view of an autohandler including a pusher according to a first embodiment of the present invention.

Now, the present invention is more specifically described with reference to accompanying drawings, wherein similar constituent elements are designated by similar reference numerals.

FIG. 1 shows an autohandler 10 including a pusher 11 according to a first embodiment of the present invention, and an inserter 14 for receiving therein and carrying a semiconductor device (package) 20 including a plurality of chips 21a and 21b. The pusher 11 presses the semiconductor device 20 downward, allowing the electrodes 22 of the semiconductor device 20 to contact respective pins 31 of the socket 30 provided in an LSI tester (not shown).

The pusher 11 has a rigid pusher body 12 and a balloon 13 used as a pressure head and attached onto the front end of the pusher body 12. The balloon 13 has a shape adapted to the top surface of the semiconductor device 20 received in the inserter 14 for measurement of the electric characteristics thereof. The semiconductor device 20 includes therein semiconductor chips 21a and 21b having different thicknesses and packaged to form an integral device. The semiconductor device 20 also has a plurality of bottom electrodes 22, such as signal pins or source pins, arranged in a matrix on the bottom surface of the semiconductor device 20. The inserter 14 is of a substantially annular shape and receives therein the semiconductor device 20 while allowing the bottom electrodes 22 of the semiconductor device 20 to appear through the opening of the annular inserter 14.

The balloon 13 is made of an air-tight film such as a fluorine-based resin film, and filled with gas such as air. In an alternative, the balloon 13 may be made of flexible fluorine-based rubber etc, and may be filled with liquid.

Figure 2:
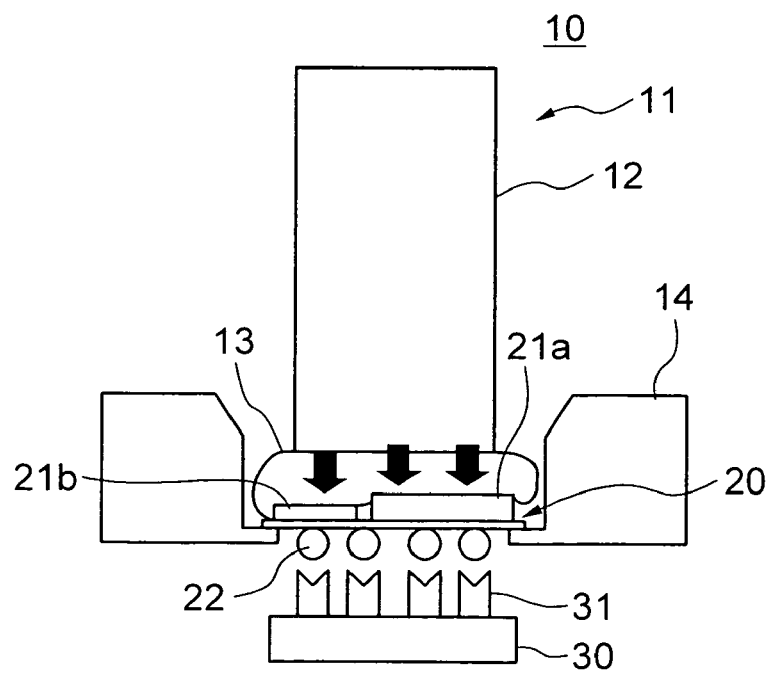
FIG. 2 is a sectional view showing the operation of the autohandler of FIG. 1.

Referring to FIG. 2 showing the operation of the autohandler 10 of FIG. 1, the inserter 14 receiving therein the semiconductor device 20 carries the semiconductor device 20 onto right above the socket pins 31 of the socket 30. The autohandler 10 allows the pusher 12 to advance downwardly and press the balloon 13 onto the semiconductor chips 21a and 21b of the semiconductor device 20, thereby allowing the bottom electrodes 22 to contact the respective pins 31 of the socket 30.

The balloon 13 provided on the front edge of the pusher body 12 is deformed to conform to the shape of the top surface of the semiconductor device 20 having a step difference. This allows a uniform pressure to be applied onto the semiconductor device 20, whereby the bottom electrodes 22 mechanically and electrically contact the respective socket pins 31 with a uniform pressure.

Figure 3:
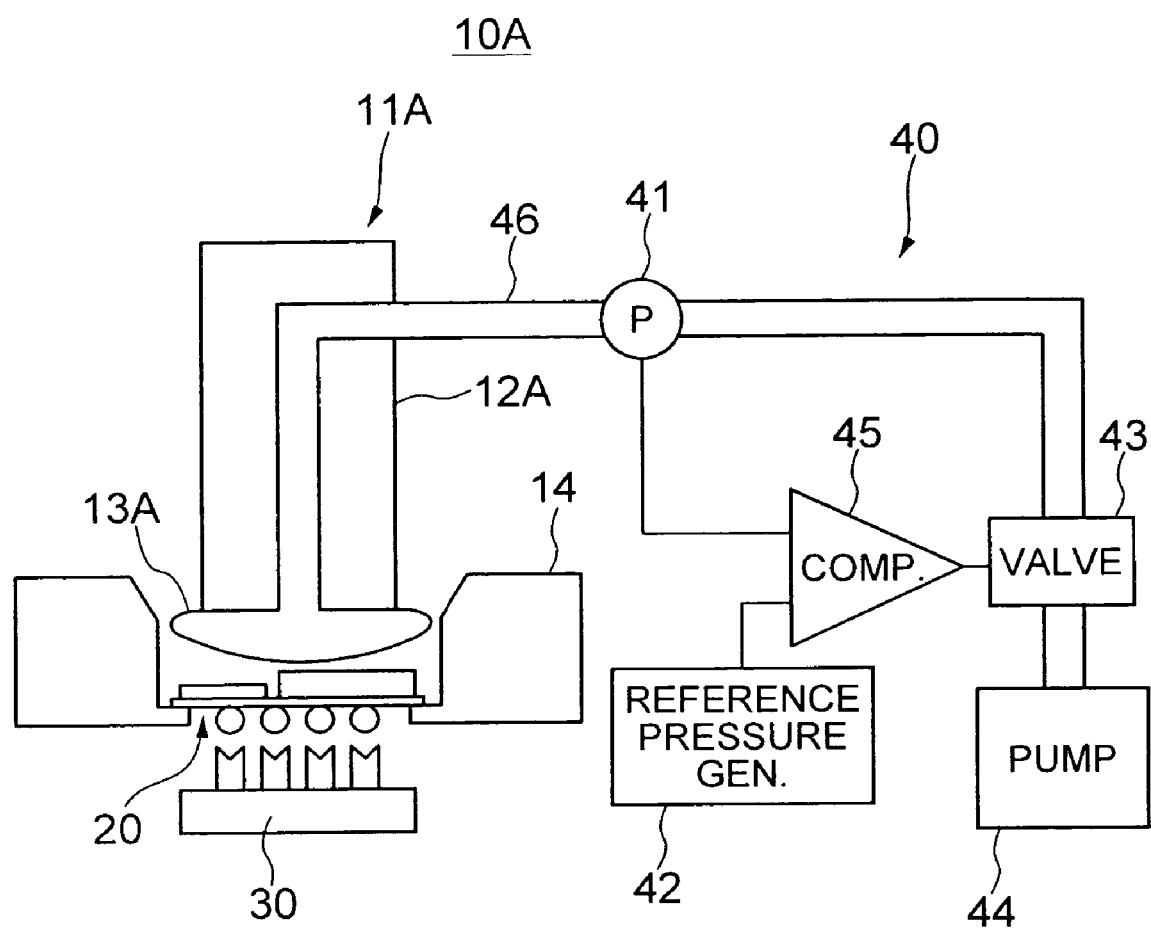
FIG. 3 is schematic sectional view of an autohandler including a pusher according to a second embodiment of the present invention.

Referring to FIG. 3, a pusher 11A according to a second embodiment of the present invention and provided in an autohandler 10A has a pusher body 12A, and a balloon 13A provided on the front end of the pusher body 12A and communicated with a fluid supply system 40 through a tube 46 penetrating the pusher body 12A.

The fluid supply system 40 includes a pump 44 for supplying a fluid to the balloon 13A through the tube 46, a pressure sensor 41 for detecting the pressure inside the tube 46, a comparator 45 for comparing the pressure signal detected by the pressure sensor 41 with a reference pressure signal fed from a reference pressure signal generator 42, and a servo valve 43 controlled by the output from the comparator 45 to control the pressure inside the tube 46 by controlling the flow rate of the fluid from the pump 44 to the tube 46. The fluid supply system 40 controls the pressure inside the balloon 13A, thereby allowing the shape of the balloon 13A to be adapted to the top surface of the semiconductor device 20 and allowing the load applied to the semiconductor device 20 to be controlled.

The fluid may be air or gas, or may be a non-compressive fluid such as silicone oil. The latter may suppress the pressure loss along the tube 46.

Figure 4:
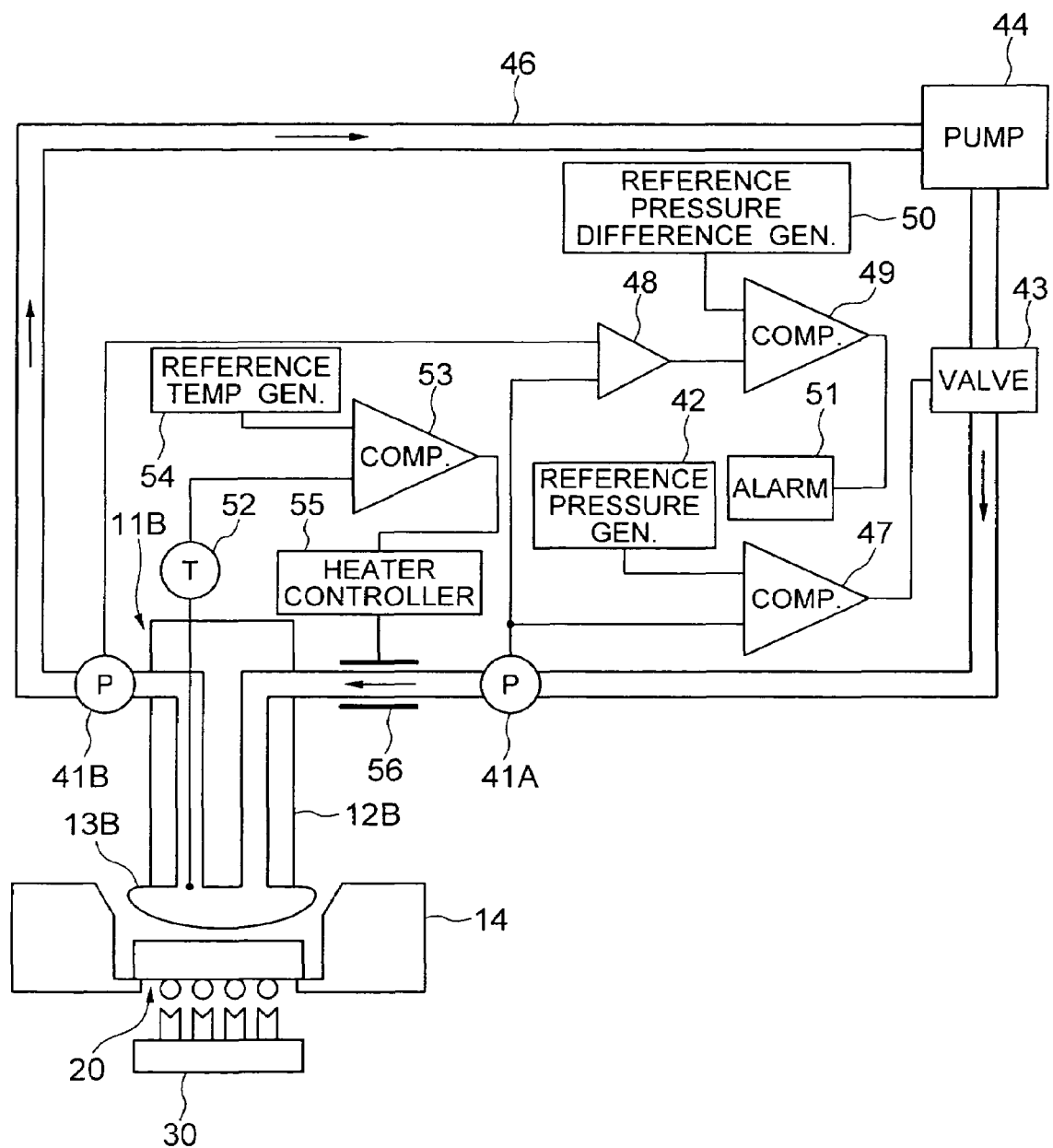
FIG. 4 is a schematic sectional view of an autohandler including a pusher according to a third embodiment of the present invention.

Referring to FIG. 4, a pusher 11B according to a third embodiment of the present invention is similar to the second embodiment except that the fluid circulates through the tube 46 and the balloon 13B, and a temperature control is performed for the fluid in the balloon 13B in the present embodiment.

The balloon 13B has a fluid inlet port and a fluid outlet port, both coupled to the tube 46 for circulation of the fluid. A pressure sensor 41A is provided for detecting the pressure of the fluid at the fluid inlet port, whereas another pressure sensor 41B is provided for detecting the pressure of the fluid at the fluid outlet port. The output of pressure sensor 41A is fed to a comparator 47, which compares the output from the pressure sensor 41A with a reference pressure signal. The output from the pressure sensor 41A is used to control the servo valve 43 similarly to the second embodiment.

The outputs from both the pressure sensors 41A and 41B are compared against each other in another comparator 48, the output of which is compared in another comparator 49 against a reference difference signal generated by a reference difference signal generator 50. The output of comparator 49 is fed to an alarm generator 51. In this configuration, the alarm generator 51 generates an alarm if the difference between the outputs from the pressure sensors 41A and 41B exceeds a reference difference due to blowout of the balloon 13B, for example.

A temperature sensor 52 is provided at the fluid outlet port of the balloon 13B to detect the fluid temperature at the fluid outlet port. The output from the temperature sensor 52 is fed to a comparator 53, which compares the output from the temperature sensor 52 against a reference temperature signal generated by a reference temperature signal generator 54. The output from the comparator 53 is fed to a heater controller 55, which controls a heater 56 for heating the fluid before entering the balloon 13B through the fluid inlet port thereof. The temperature control of the fluid controls the temperature of the semiconductor device during measurement of the electric characteristics. In this configuration, the measurement of the electric characteristics of the semiconductor device can be performed at a desired temperature of the semiconductor device 20. The fluid may be preferably non-compressive fluid for an efficient heat exchange between the fluid and the semiconductor device 20.

Figure 5:
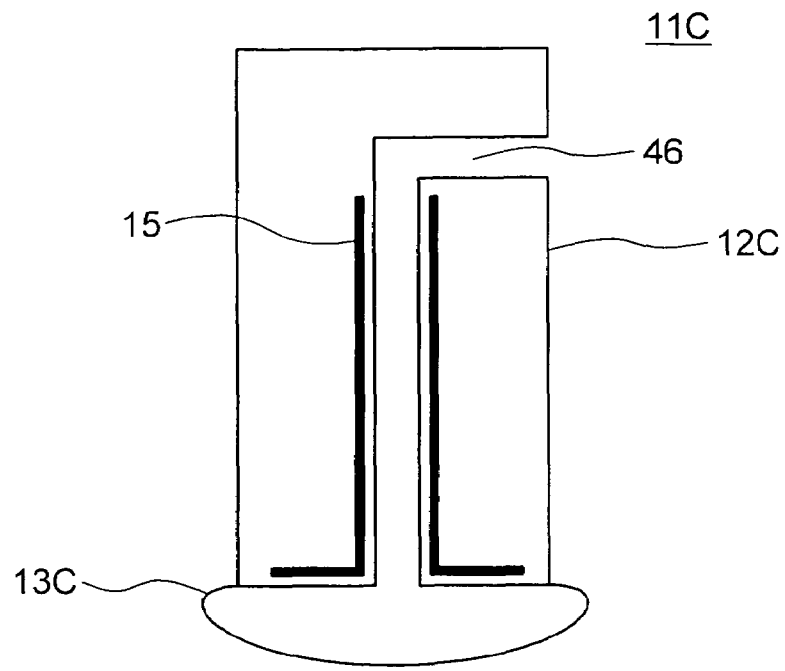
FIG. 5 is a schematic sectional view of a pusher according to a fourth embodiment of the present invention.

FIG. 5 shows the configuration of a pusher according to a fourth embodiment of the present invention. In this configuration, the pusher 11C includes a pusher body 12C, a balloon 13C attached onto the front end of the pusher body 12C, and a heater 15 installed in the pusher body 12C for surrounding the tube 46 within the pusher body 12C. The heater 15 replaces the heater 56 in FIG. 4.

Figure 6:
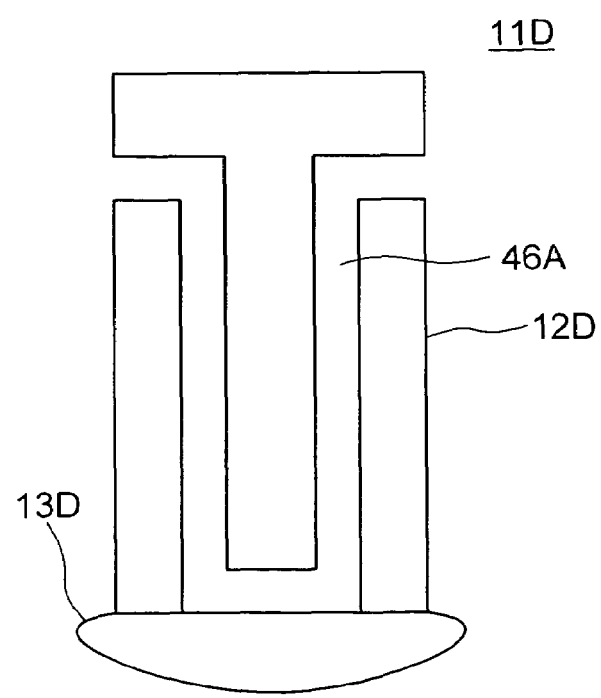
FIG. 6 is a schematic sectional view of a pusher according to a fifth embodiment of the present invention.
Figure 7:
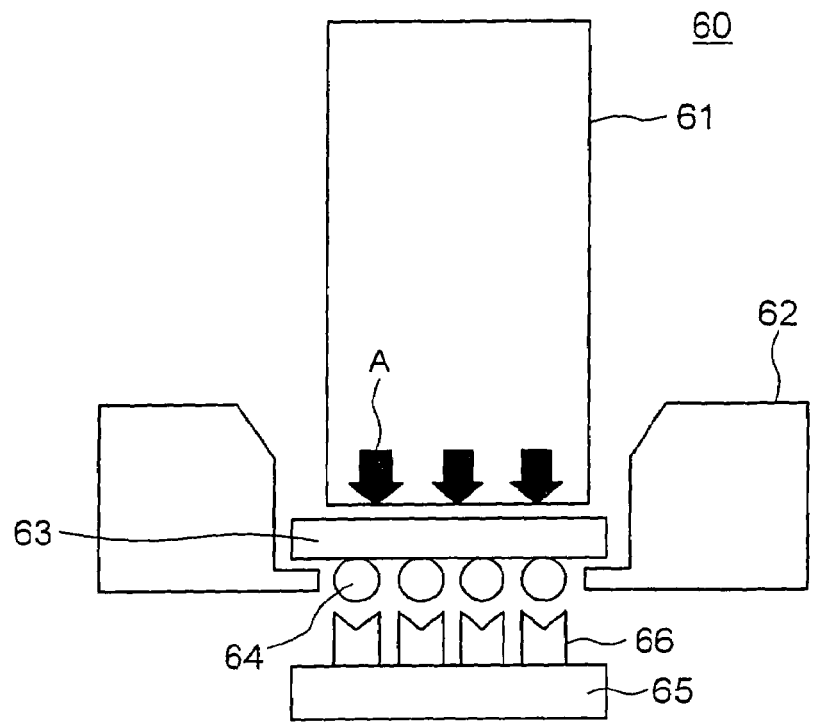
FIG. 7 is a schematic sectional view of an autohandler including a conventional pusher.
Figure 8:
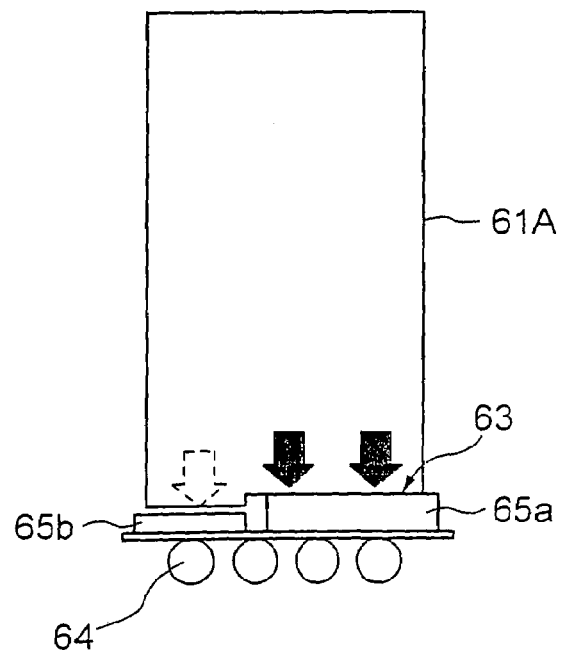
FIG. 8 is a sectional view showing the operation of the autohandler of FIG. 7.
Figure 9:
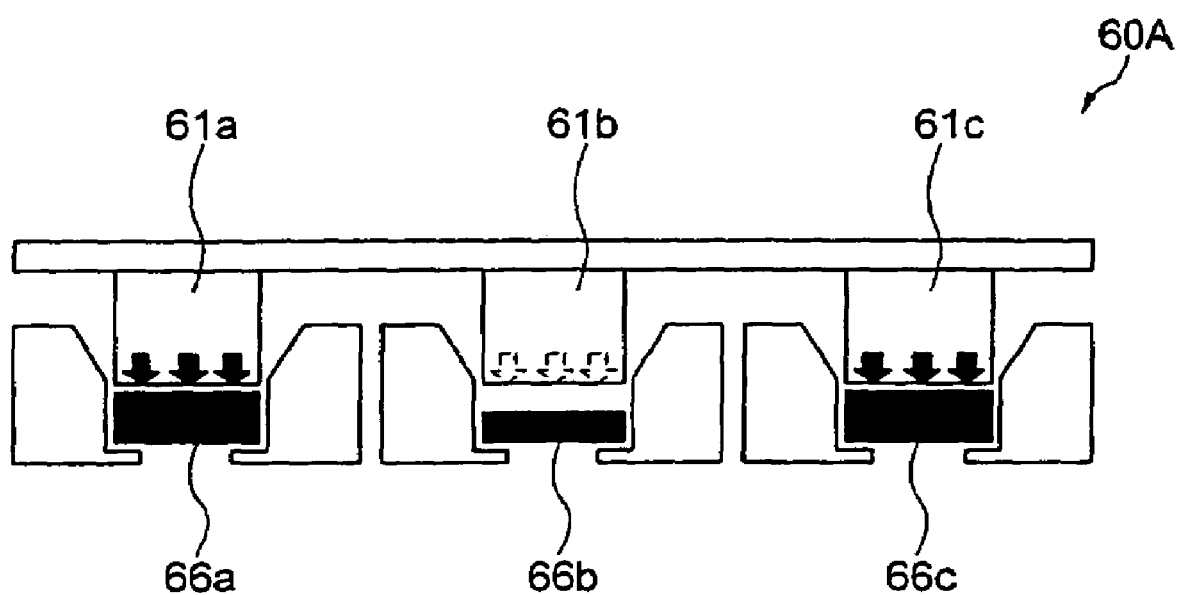
FIG. 9 is another sectional view showing the operation of the autohandler of FIG. 7.

FIG. 6 shows the configuration of a pusher according to a fifth embodiment of the present invention. In this configuration, the pusher body 12D has a tube 46A within the pusher body 12D for circulating the fluid through the tube 46A. The chamber in the balloon 13D is separated from the tube 46A. The pressure of the fluid flowing through the tube 46A of the pusher body 12D presses the balloon 13D toward the semiconductor device. The balloon 13D assists the heat exchange between the semiconductor device and the fluid flowing through the tube 46A in the pusher body 12D.

Since the above embodiments are described only for examples, the present invention is not limited to the above embodiments and various modifications or alterations can be easily made therefrom by those skilled in the art without departing from the scope of the present invention.

What is claimed is:

1. A pusher in an autohandler for pressing a semiconductor device, comprising:
   a pusher body; and
   a pressure head attached onto said pusher body for pressing the semiconductor device, said pressure head including a balloon that directly contacts the semiconductor device and fluid received in said balloon.

2. The pusher according to claim 1, further comprising a fluid supply system for introducing said fluid into said balloon.

3. The pusher according to claim 2, wherein said balloon is made of an elastic film.

4. The pusher according to claim 2, wherein said fluid supply system controls a pressure of said fluid.

5. The pusher according to claim 2, wherein said fluid supply system includes an alarm generator for detecting an excessive pressure rise of said fluid.

6. The pusher according to claim 2, wherein said fluid supply system circulates said fluid to pass through said balloon.

7. The pusher according to claim 6, wherein said fluid supply system includes an alarm generator for detecting an excessive difference between pressures at a fluid inlet and a fluid outlet of said balloon.

8. A pusher device in an autohandler for pressing a semiconductor device, comprising:
   a pusher body; and
   a pressure head attached onto said pusher body for pressing the semiconductor device, said pressure head including a balloon and fluid reservoir received in said balloon; and
   a fluid supply system for introducing said fluid into said balloon,
   wherein said fluid supply system circulates said fluid to pass through said balloon, and
   wherein said fluid supply system includes a heater for heating said fluid.

9. A testing device for testing a semiconductor device comprising:
   a socket including a plurality of test pins connected to a test circuit; and
   a pusher for pressing the semiconductor device toward said socket, thereby allowing a plurality of electrodes of said semiconductor device to contact respective said test pins, said pusher comprising:
   a pusher body; and
   a pressure head attached onto said pusher body for pressing the semiconductor device, said pressure head including a balloon directly applying pressure to the semiconductor device and fluid received in said balloon.

* * * * *